(12) United States Patent
Oki

(10) Patent No.: US 7,006,030 B2
(45) Date of Patent: Feb. 28, 2006

(54) SEMICONDUCTOR INTEGRATED CIRCUIT DEVICE AND AUDIO APPLIANCE EMPLOYING IT

(75) Inventor: Takashi Oki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/839,181

(22) Filed: May 6, 2004

(65) Prior Publication Data

US 2004/0222915 A1 Nov. 11, 2004

(30) Foreign Application Priority Data

May 9, 2003 (JP) .............................. 2003-131935

(51) Int. Cl.
H03M 1/66 (2006.01)
(52) U.S. Cl. ......................... 341/899; 257/508; 174/36
(58) Field of Classification Search ................ 341/899; 257/508; 174/36
See application file for complete search history.

(56) References Cited

U.S. PATENT DOCUMENTS 5,592,391 A * 1/1997 Muyshondt et al. .......... 716/15
5,811,882 A * 9/1998 Latham et al. .............. 257/508
6,239,615 B1 * 5/2001 Ngai et al. ..................... 326/41
6,694,494 B1 * 2/2004 Weis .............................. 716/2
2002/0113767 A1 * 8/2002 Lin et al. ...................... 345/98
2003/0122155 A1 * 7/2003 Ohguro ....................... 257/200
2004/0145033 A1 * 7/2004 McElvain ................... 257/659

FOREIGN PATENT DOCUMENTS

| JP | 61-194848 | 8/1986 |
| JP | 3-23934 | 3/1991 |
| JP | 05-047943 | 2/1993 |
| JP | 06-045528 | 2/1994 |
| JP | 11-238846 | 8/1999 |

* cited by examiner

Primary Examiner—Howard L. Williams
(74) Attorney, Agent, or Firm—Arent Fox PLLC

(57) ABSTRACT

A semiconductor integrated circuit device has an analog signal conductor and a digital signal conductor formed on a single circuit board. In the lowest layer is laid a polysilicon conductor as the digital signal conductor, on top thereof is laid a first aluminum conductor as a shielding conductor, and further on top thereof is laid a second aluminum conductor as the analog signal conductor. With this structure, it is possible to give the highest priority to improving the transmission quality of analog signals and simultaneously reduce transfer of noise from the digital signal conductor to the analog signal conductor.

6 Claims, 2 Drawing Sheets

CROSSING PERMITTED:
ONLY ANALOG SIGNAL CONDUCTOR
LEADING TO LOW-INPEDANCE CIRCUIT

SEMICONDUCTOR INTEGRATED CIRCUIT DEVICE AND AUDIO APPLIANCE EMPLOYING IT

This application is based on Japanese Patent Application No. 2003-131935 filed on May 9, 2003, the contents of which are hereby incorporated by reference.

BACKGROUND OF THE INVENTION

1. Field of the Invention

The present invention relates to a semiconductor integrated circuit device having conductors for analog signals and conductors for digital signals formed on a single circuit board. The present invention also relates to an audio appliance employing such a semiconductor integrated circuit device.

2. Description of the Prior Art

In a semiconductor integrated circuit device having conductors for analog signals and conductors for digital signals formed on a single circuit board, it is essential to take measures to reduce crosstalk between conductors in designing the layout of conductors. In conventional semiconductor integrated circuit devices, the common approaches to minimizing crosstalk are: (1) minimizing the area over which two conductors cross each other (see FIG. 3A), (2) laying a conductor to make a detour so as not to cross another conductor (see FIG. 3B), and (3) permitting only an analog signal conductor leading to a low-impedance circuit to cross a digital signal conductor (see FIG. 3C). It should be noted that, in FIGS. 3A to 3C, analog signal conductors are indicated by L1 and digital signal conductors are indicated by L2.

It is true that, with a semiconductor integrated circuit device in which one or more of the approaches mentioned above is adopted against crosstalk, it is possible to reduce transfer of noise from a digital signal conductor to an analog signal conductor and thereby achieve satisfactory transmission of an analog signal.

However, the approach (1) above has the disadvantage of increasing the resistance in a narrowed part of a conductor, resulting in an increased signal attenuation factor. The approach (2) above has the disadvantage of increasing the resistance in a detouring part of a conductor, resulting in an increased signal attenuation factor, and also has the disadvantage of unnecessarily enlarging the chip size. The approach (3) above has the disadvantage of permitting only a limited type of analog signal conductor to cross a digital signal conductor.

It is particularly difficult to adopt the approaches (1) to (3) mentioned above in an operational amplifier IC designed for use in an audio appliance ready for a multiple-channel sound system (such as a home-theater apparatus or television monitor apparatus ready for the 5.1-channel sound system). The reasons are, among others, that, in such circuitry, (i) the resistive components of analog signal conductors need to be minimized, (ii) detouring is not tolerated beyond a certain limit in designing the layout of multiple-channel analog signal conductors, and (iii) the input impedances of operational amplifier circuits to which analog signal conductors are connected are high. As a consequence, in the audio apparatus mentioned above, when a digital operation is performed (for example, to control the sound volume) during the playback of an audio signal (analog signal), noise may be transferred from a digital signal conductor to an analog signal conductor, producing audible noise in the audio output.

In addition to the already-mentioned approaches, there has conventionally been disclosed and proposed a technique for reducing crosstalk whereby a low-impedance shielding conductor is inserted between an analog signal conductor and a digital signal conductor (see, for example, Japanese Patent Application Laid-Open No. H5-47943).

It is true that, with the semiconductor integrated circuit device disclosed in the publication mentioned above, it is possible to reduce transfer of noise from a digital signal conductor to an analog signal conductor and thereby achieve satisfactory transmission of an analog signal.

However, in a common semiconductor integrated circuit device having conductors for analog signals and conductors for digital signals formed on a single circuit board, priority is almost always given to improving the transmission quality of digital signals and to improving the response, rather than to improving the transmission quality of analog signals. The semiconductor integrated circuit device disclosed in the publication mentioned above is no exception, because there, whereas digital signal conductors are formed of aluminum, which is a low-impedance material, analog signal conductors are formed of polysilicon, which is a high-impedance material. That is, in conventional semiconductor integrated circuit devices including the one disclosed in the publication mentioned above, analog signal conductors have never given priority over digital signal conductors in terms of the use of aluminum as their material. As a consequence, according to the prior-art technique mentioned above, analog signal conductors tend to have resistive components so high as to invite transfer of noise thereto. This, disadvantageously, diminishes the effect of the insertion of shielding conductors and also degrades the signal attenuation factor for analog signals.

Needless to say, in a case where digital signals having frequencies as high as 100 [MHz] or more are handled, there is no choice but to adopt the prior-art technique mentioned above to give priority to improving their transmission quality and to improving the response. However, in a semiconductor integrated circuit device such as an operational amplifier IC designed for use in an audio appliance or the like, where the highest priority is given to improving the transmission quality of analog signals (audio signals), on which the playback sound quality depends, and where the transmission quality of digital signals (for example, appliance operation signals having frequencies of 1 [MHz] or less) and related characteristics are of less importance, the technique against crosstalk disclosed in the publication mentioned above is not best-suited.

The applicant of the present invention once disclosed and proposed a technique of using, for signals having different frequencies, conductors laid in different layers (see Japanese Patent Application Laid-Open No. H11-238846). However, the technique disclosed in this publication is aimed, first and foremost, at giving redundancy to a low-frequency circuit in a digital circuit, and contributes only to a limited extent, with a well-devised circuit layout, to what the present invention is aimed at (i.e., reducing transfer of noise from a digital signal conductor to an analog signal conductor).

SUMMARY OF THE INVENTION

An object of the present invention is to provide a semiconductor integrated circuit device that gives the highest priority to improving the transmission quality of analog signals but that nevertheless permits reduction of transfer of noise from a digital signal conductor to an analog signal conductor. Another object of the present invention is to provide an audio appliance employing such a semiconductor integrated circuit device.

To achieve the above object, according to one aspect of the present invention, in a semiconductor integrated circuit device having an analog signal conductor and a digital signal conductor formed on a single circuit board, the analog signal conductor is given a lower impedance than the digital signal conductor.

In the semiconductor integrated circuit device structured as described above, advisably, a shielding conductor is laid in at least one layer between the analog signal conductor and the digital signal conductor.

In the semiconductor integrated circuit device structured as described above, advisably, the shielding conductor is laid parallel to the analog signal conductor along the entire length of the analog signal conductor.

According to another aspect of the present invention, an audio appliance is provided with, as an operational amplifier IC, a semiconductor integrated circuit device structured as described above.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
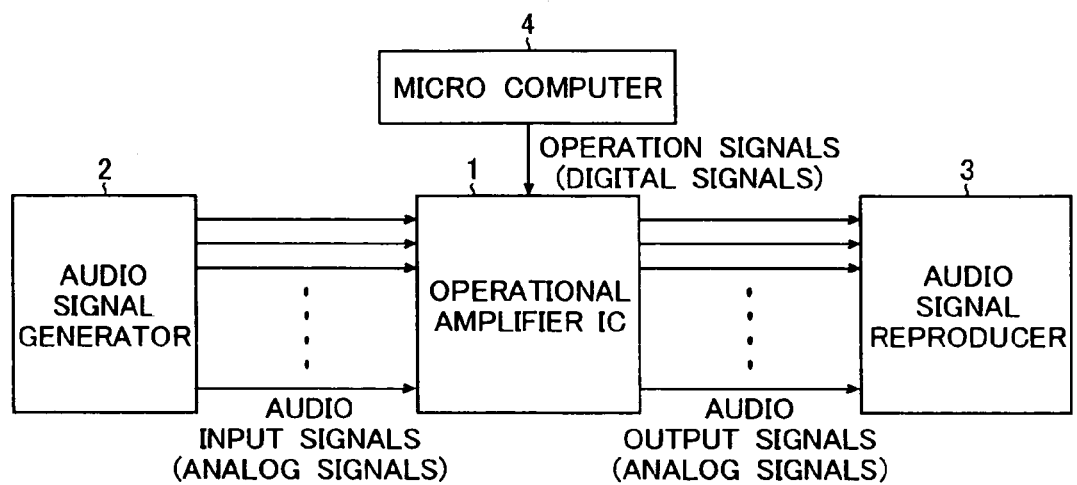
FIG. 1 is a block diagram showing the flow of signals in an operational amplifier IC embodying the invention.

Hereinafter, an example will be described of how the present invention is applied to an operational amplifier IC designed for use in an audio appliance ready for a multiple-channel sound system. FIG. 1 is a block diagram showing the flow of signals in an operational amplifier IC embodying the invention. As shown in this figure, the operational amplifier IC 1 of this embodiment is an integrated circuit that receives multiple-channel audio signals (analog signals) from an audio signal generator 2 (such as the pickup of a DVD playback apparatus), that then amplifies them at a predetermined gain, and that then feeds them to an audio signal reproducer 3 (such as speakers) provided in the succeeding stage. The gain of the operational amplifier IC 1 and other parameters are controlled by operation signals (digital signals having frequencies of 1 [MHz] or less) fed from a microcomputer 4.

Figure 2:
FIG. 2 is a vertical sectional view showing an operational amplifier IC embodying the invention.
Figure 3A:
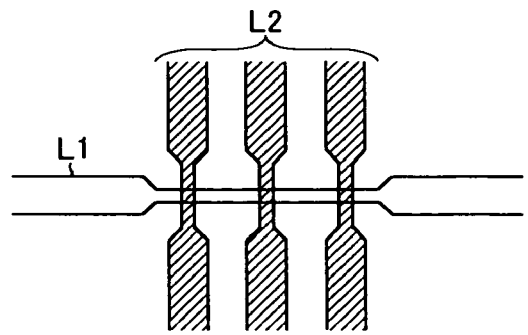
FIGS. 3A to 3C are diagrams illustrating conventional approaches to reducing crosstalk.
Figure 3B:
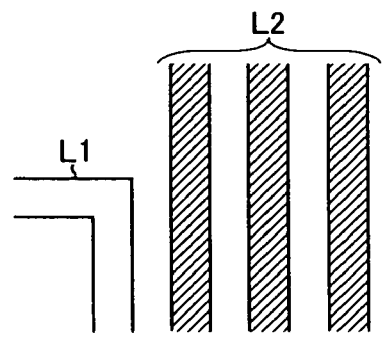
Figure 3C:
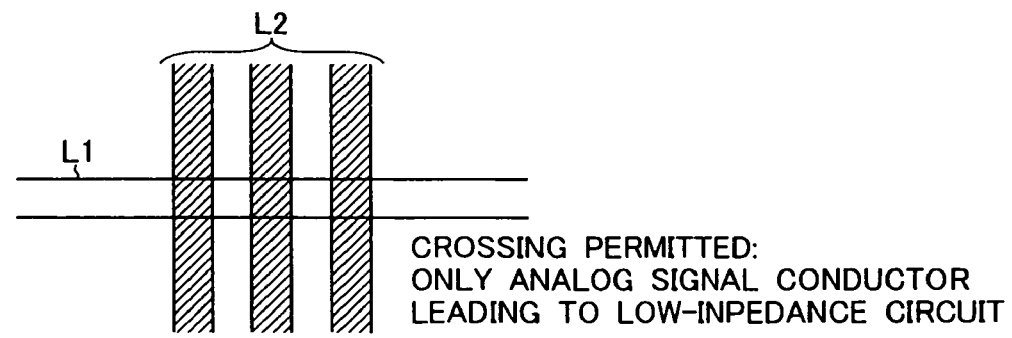

Next, with reference to FIG. 2, the measures taken against crosstalk in the operational amplifier IC 1 will be described. FIG. 2 is a vertical sectional view showing an operational amplifier IC embodying the invention, and shows the measures taken against crosstalk in a case where an analog signal conductor and a digital signal conductor are laid one above the other vertically. In this embodiment, it is assumed that the operational amplifier IC 1 is formed by a two-layer Al process.

As shown in FIG. 2, in the operational amplifier IC 1 of this embodiment, in the lowest layer is laid a polysilicon conductor P as a digital signal conductor, on top thereof is laid a first aluminum layer AL1 as a shielding conductor, and further on top thereof is laid a second aluminum layer AL2 as an analog signal conductor. That is, the operational amplifier IC 1 of this embodiment can be said to be so structured that analog signal conductors are given priority over digital signal conductors in terms of the use of aluminum as their material. Here, to the shielding conductor AL1 is applied a predetermined potential (for example, the ground potential).

Let the wiring resistance of the analog signal conductor AL2 be R, the frequency of the digital signal be f, and the parasitic capacitance between the conductors is C. Then, if the shielding conductor AL1 is not laid between the digital signal conductor P and the analog signal conductor AL2, noise is transferred from the digital signal conductor P to the analog signal conductor AL2 by a factor of $R/(R+1/2\pi fC)$. By contrast, if the low-impedance shielding conductor AL1 is sandwiched between the digital signal conductor P and the analog signal conductor AL2 as in the operational amplifier IC 1 structured as described above, noise from the digital signal conductor P is absorbed by the shielding conductor AL1. This cuts off the noise transfer path through the parasitic capacitance C, and thus prevents the noise from being transferred to the analog signal conductor AL2.

Moreover, in the operational amplifier IC 1 of this embodiment, the analog signal conductor is formed as an aluminum conductor AL2, and thus has a low resistive component. This too helps reduce transfer of noise, and is expected also to reduce the signal attenuation factor for analog signals. Accordingly, the measures against crosstalk described above can be said to be best-suited in a semiconductor integrated circuit device like the operational amplifier IC 1 where the highest priority is given to improving the transmission quality of analog signals (audio signals), on which the playback sound quality depends, and where the transmission quality of digital signals and related characteristics and are of less importance.

In the embodiment described above, the shielding conductor AL1 may be sandwiched between the digital signal conductor P and the analog signal conductor AL2 at the place where they cross each other, or may be laid parallel to the analog signal conductor AL2 along the entire length thereof. Adopting the latter structure particularly helps obtain a higher shielding effect and thereby further reduce transfer of noise from a digital signal conductor to an analog signal conductor.

The embodiment described above deals with a case where the operational amplifier IC 1 is formed by a two-layer Al process. It is, however, also possible to adopt any other process. Specifically, the present invention is applicable also to a semiconductor integrated circuit device formed by a multiple-layer Al process. In that case, the most effective is the structure in which in the lowest layer is laid a polysilicon conductor as a digital signal conductor, on top thereof are laid a plurality of aluminum conductors as shielding conductors, and further on top thereof is laid an aluminum conductor as an analog signal conductor.

The embodiment described above deals with a case where the present invention is applied to an operational amplifier IC for use in an audio appliance. It is, however, also possible to apply the present invention to other types of target. Specifically, the present invention is generally applicable to semiconductor integrated circuit devices having analog signal conductors and digital signal conductors formed on a single circuit board (in particular, those in which the highest priority is given to the transmission quality of analog signals and the transmission quality of digital signals is of less importance).

As described above, according to the present invention, in a semiconductor integrated circuit device having an analog signal conductor and a digital signal conductor formed on a single circuit board, the analog signal conductor is given a lower impedance than the digital signal conductor. This structure reduces transfer of noise to an analog signal conductor, and also helps improve the signal attenuation factor for the analog signal itself. Thus, it is possible to give the highest priority to improving the transmission quality of analog signals and simultaneously reduce transfer of noise from digital signal conductors to analog signal conductors.

In the semiconductor integrated circuit device structured as described above, advisably, a shielding conductor is laid in at least one layer between the analog signal conductor and the digital signal conductor. In this structure, noise from the digital signal conductor is absorbed by the shielding conductor. This cuts off the noise transfer path through the parasitic capacitance, and thus prevents the noise from being transferred to the analog signal conductor AL2.

In the semiconductor integrated circuit device structured as described above, advisably, the shielding conductor is laid parallel to the analog signal conductor along the entire length of the analog signal conductor. With this structure, it is possible to obtain a higher shielding effect and thereby further reduce transfer of noise from a digital signal conductor to an analog signal conductor.

According to the present invention, an audio appliance is provided with, as an operational amplifier IC, a semiconductor integrated circuit device structured as described above. By applying the present invention to a semiconductor integrated circuit device where the highest priority is given to improving the transmission quality of analog signals (audio signals), on which the playback sound quality depends, and where the transmission quality of digital signals and related characteristics are of less importance, it is possible to take the best-suited measures against crosstalk therein.

What is claimed is:

1. A semiconductor integrated circuit device comprising:
    an amplification stage that amplifies a multiple-channel analog audio signal fed from an audio signal generator at a predetermined gain corresponding to a digital operation signal fed from a microcomputer and that then feeds the amplified multiple-channel analog audio signal to an audio signal reproducer provided at a succeeding stage;
    an analog signal conductor that serves as an analog signal input oath from the audio signal generator to the amplification stage and as an analog signal output path from the amplification stage to the audio signal reproducer; and
    a digital signal conductor that serves as a digital signal input oath from the microcomputer to the amplification stage,
    wherein the analog signal conductor and the digital signal conductor are formed on a single circuit board, and the analog signal conductor has a lower impedance than the digital signal conductor.

2. A semiconductor integrated circuit device as claimed in claim 1, further comprising:
    shielding conductors laid in a plurality of layers,
    wherein the semiconductor integrated circuit device is fabricated by a multiple-layer Al process, with a polysilicon conductor in a lowermost layer used as the digital signal conductor, with aluminum conductors in a plurality of layers above the lowermost layer used as the shielding conductors, with an aluminum conductor in an uppermost layer used as the analog signal conductor, so that the shielding conductor is formed between the analog signal conductor and the digital signal conductor.

3. A semiconductor integrated circuit device as claimed in claim 2,
    wherein the shielding conductor is laid parallel to the analog signal conductor along an entire length of the analog signal conductor.

4. An audio appliance ready for a multiple-channel system, the audio appliance comprising:
    an audio signal generator that generates a multiple-channel analog audio signal;
    an operational amplifier IC that amplifies the multiple-channel analog audio signal fed from the audio signal generator at a predetermined gain and that then feeds the amplified multiple-channel analog audio signal to a succeeding stage;
    an audio signal reproducer that reproduces the multiple-channel analog audio signal fed from the operational amplifier IC; and
    a microcomputer that adjusts the gain of the operational amplifier IC by using a digital operation signal,
    wherein the operational amplifier IC comprises:
    an amplification stage that amplifies the multiple-channel analog audio signal fed from the audio signal generator at the predetermined gain corresponding to the digital operation signal fed from the microcomputer and that then feeds the amplified multiple-channel analog audio signal to the audio signal reproducer provided at the succeeding stage;
    an analog signal conductor that serves as an analog signal input path from the audio signal generator to the amplification stage and as an analog signal output oath from the amplification stage to the audio signal reproducer; and
    a digital signal conductor that serves as a digital signal input path from the microcomputer to the amplification stage,
    wherein the operational amplifier IC is a semiconductor integrated circuit device having an analog signal conductor and a digital signal conductor formed on a single circuit board, the analog signal conductor having a lower impedance than the digital signal conductor.

5. An audio appliance as claimed in claim 4, further comprising:
    shielding conductors laid in a plurality of layers,
    wherein the semiconductor integrated circuit device is fabricated by a multiple-layer Al process, with a polysilicon conductor in a lowermost layer used as the digital signal conductor, with aluminum conductors in a plurality of layers above the lowermost layer used as the shielding conductors, with an aluminum conductor in an uppermost layer used as the analog signal conductor, so that the shielding conductor is formed between the analog signal conductor and the digital signal conductor.

6. An audio appliance as claimed in claim 5,
    wherein the shielding conductor is laid parallel to the analog signal conductor along an entire length of the analog signal conductor.

* * * * *